United States Patent
Sako et al.

(10) Patent No.: US 11,417,401 B2
(45) Date of Patent: Aug. 16, 2022

(54) SEMICONDUCTOR MEMORY DEVICE

(71) Applicant: KIOXIA CORPORATION, Tokyo (JP)

(72) Inventors: Mario Sako, Yokohama Kanagawa (JP); Hiromitsu Komai, Kamakura Kanagawa (JP); Masahiro Yoshihara, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/008,209

(22) Filed: Aug. 31, 2020

(65) Prior Publication Data

US 2021/0090666 A1 Mar. 25, 2021

(30) Foreign Application Priority Data

Sep. 19, 2019 (JP) .............................. JP2019-170336

(51) Int. Cl.
| | |
|---|---|
| G11C 16/26 | (2006.01) |
| H01L 23/522 | (2006.01) |
| G11C 16/04 | (2006.01) |
| G11C 16/10 | (2006.01) |
| H01L 27/11529 | (2017.01) |
| H01L 27/11582 | (2017.01) |
| H01L 27/11573 | (2017.01) |
| H01L 27/11556 | (2017.01) |

(52) U.S. Cl.
CPC .......... G11C 16/26 (2013.01); G11C 16/0483 (2013.01); G11C 16/10 (2013.01); H01L 23/5223 (2013.01); G11C 2216/20 (2013.01); H01L 27/11529 (2013.01); H01L 27/11556 (2013.01); H01L 27/11573 (2013.01); H01L 27/11582 (2013.01)

(58) Field of Classification Search
CPC ..... G11C 16/26; G11C 16/0483; G11C 16/10; G11C 2216/20; G11C 11/5628; G11C 11/5642; G11C 2211/5642; G11C 16/32; G11C 16/3418; H01L 23/5223; H01L 27/11529; H01L 27/11556; H01L 27/11573; H01L 27/11582
USPC ...................................................... 365/185.21
See application file for complete search history.

(56) References Cited

U.S. PATENT DOCUMENTS

| | | |
|---|---|---|
| 8,358,545 B2 | 1/2013 | Sako et al. |
| 9,230,677 B2 | 1/2016 | Lee |
| 2010/0097856 A1* | 4/2010 | Elmhurst ........... G11C 16/3459 365/185.03 |

FOREIGN PATENT DOCUMENTS

JP 2005-100625 A 4/2005

* cited by examiner

*Primary Examiner* — Amir Zarabian
*Assistant Examiner* — Minh Dinh
(74) *Attorney, Agent, or Firm* — Kim & Stewart LLP

(57) ABSTRACT

A semiconductor memory device includes a bit line, a first memory cell electrically connected to the bit line, and a sense amplifier connected to the bit lin. The sense amplifier includes a first capacitor element having an electrode that is connected to a first node electrically connectable to the bit line, a first transistor having a gate connected to the first node and a first end connectable to a second node, a second transistor having a first end connected to the second node and a second end connected to a third node, a second capacitor element having an electrode connected to the third node, and a latch circuit connected to the second node.

18 Claims, 13 Drawing Sheets

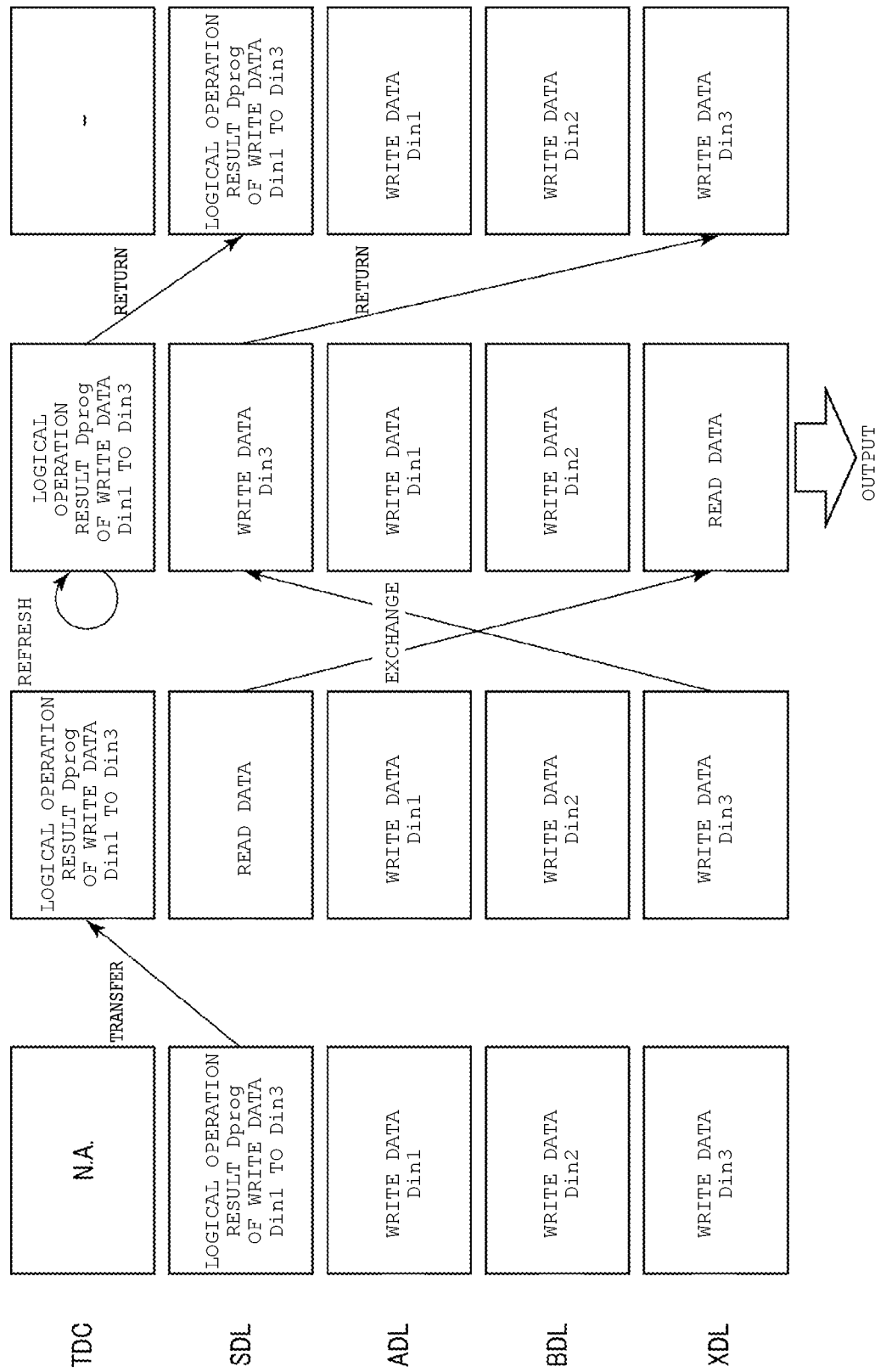

SEMICONDUCTOR MEMORY DEVICE

CROSS-REFERENCE TO RELATED APPLICATION

This application is based upon and claims the benefit of priority from Japanese Patent Application No. 2019-170336, filed Sep. 19, 2019, the entire contents of which are incorporated here by reference.

FIELD

Embodiments relate to a semiconductor memory device.

BACKGROUND

A NAND flash memory is known as a semiconductor memory device.

BRIEF DESCRIPTION OF THE DRAWINGS

FIG. 9 is a diagram illustrating data transfers in the sense amplifier during the interrupt operation of the semiconductor memory device according to one embodiment.

DETAILED DESCRIPTION

Figure 1:
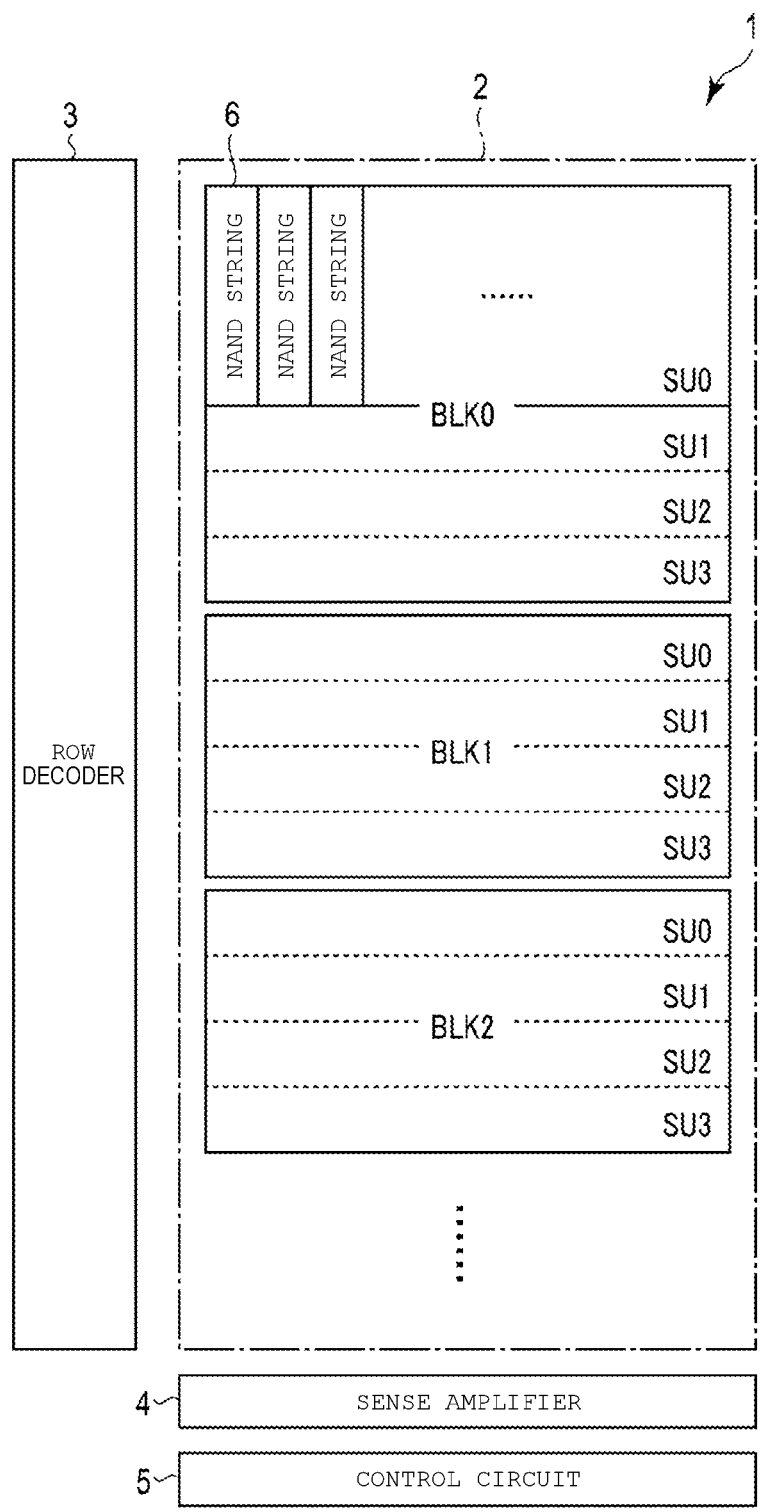
FIG. 1 is a block diagram of a semiconductor memory device according to one embodiment.

In general, according to one embodiment, there is provided a semiconductor memory device including a bit line, a first memory cell electrically connected to the bit line, and a sense amplifier connected to the bit lin. The sense amplifier includes a first capacitor element having an electrode that is connected to a first node electrically connectable to the bit line, a first transistor having a gate connected to the first node and a first end connectable to a second node, a second transistor having a first end connected to the second node and a second end connected to a third node, a second capacitor element having an electrode connected to the third node, and a latch circuit connected to the second node.

Hereinafter, embodiments will be described with reference to the accompanying drawings. In this description, the same parts are denoted by the same reference numerals across all the drawings.

1. One Embodiment

A semiconductor memory device according to one embodiment will be described. Hereinafter, a three-dimensional stacked NAND flash memory in which memory cell transistors are three-dimensionally stacked on a semiconductor substrate will be described as an example of a semiconductor memory device.

1.1 Configuration

1.1.1 Overall Configuration of Semiconductor Memory Device

First, the overall configuration of the semiconductor memory device according to this embodiment will be described with reference to FIG. 1. FIG. 1 is a block diagram of a NAND flash memory according to an embodiment.

As illustrated, a NAND flash memory 1 includes a memory cell array 2, a row decoder 3, a sense amplifier 4, and a control circuit 5.

The memory cell array 2 includes a plurality of blocks BLK (BLK0, BLK1, BLK2, . . . ) including nonvolatile memory cell transistors associated with rows and columns. Each block BLK includes, for example, four string units SU (SU0 to SU3). Each string unit SU includes a plurality of NAND strings 6. The number of blocks in the memory cell array 2 and the number of string units in the block are not limited to any particular number. Details of the memory cell array 2 will be described later.

The row decoder 3 decodes a row address, selects one of the blocks BLK based on the decoding result, and further selects any one of the string units SU. Then, a required voltage is output to the block BLK. The row address is provided from a controller that controls the NAND flash memory 1, for example.

During a read operation of data, the sense amplifier 4 senses data read from the memory cell array 2. Then, the read data is output to the controller. During a write operation of data, the sense amplifier 4 transfers write data received from an external controller to the memory cell array 2.

The control circuit 5 controls the operation of the entire NAND flash memory 1.

The NAND flash memory 1 having the configuration described above is connected to an external controller (not illustrated) via a NAND interface. Signals transmitted and received between the controller and the NAND flash memory 1 include a chip enable signal /CE, a command latch enable signal CLE, an address latch enable signal ALE, a write enable signal /WE, a read enable signal /RE, a signal /WP, a ready/busy signal /RB, and a signal I/O <7:0>.

The signal /CE is a signal for enabling the NAND flash memory 1. The signal CLE notifies the NAND flash memory 1 that the signal I/O <7:0> supplied to the NAND flash memory 1 while the signal CLE is at the "H (High)" level is a command. The signal ALE notifies the NAND flash memory 1 that the signal I/O <7:0> supplied to the NAND flash memory 1 while the signal ALE is at the "H" level is an address. The signal /WE instructs the NAND flash memory 1 that the signal I/O <7:0> supplied to the NAND flash memory 1 be received into the NAND flash memory 1 while the signal/WE is at the "L (Low)" level. The signal /RE instructs the NAND flash memory 1 to output the signal I/O <7:0>. The signal /WP instructs the NAND flash memory 1 to prohibit writing of data and erasing of data. The signal /RB indicates whether the NAND flash memory 1 is in a ready state (a state in which the NAND flash memory 1 is ready to receive an external command) or a busy state (a state in which the NAND flash memory 1 is not ready to receive the external command). The signal I/O <7:0> is, for example, an 8-bit signal. The signal I/O <7:0> represents data transmitted and received between the controller and the NAND flash memory 1, and may include a command CMD, an address ADD, or data DAT. Data DAT includes write data and read data. The controller controls the NAND flash memory 1 using these signals.

1.1.2 Configuration of Block BLK

Figure 2:
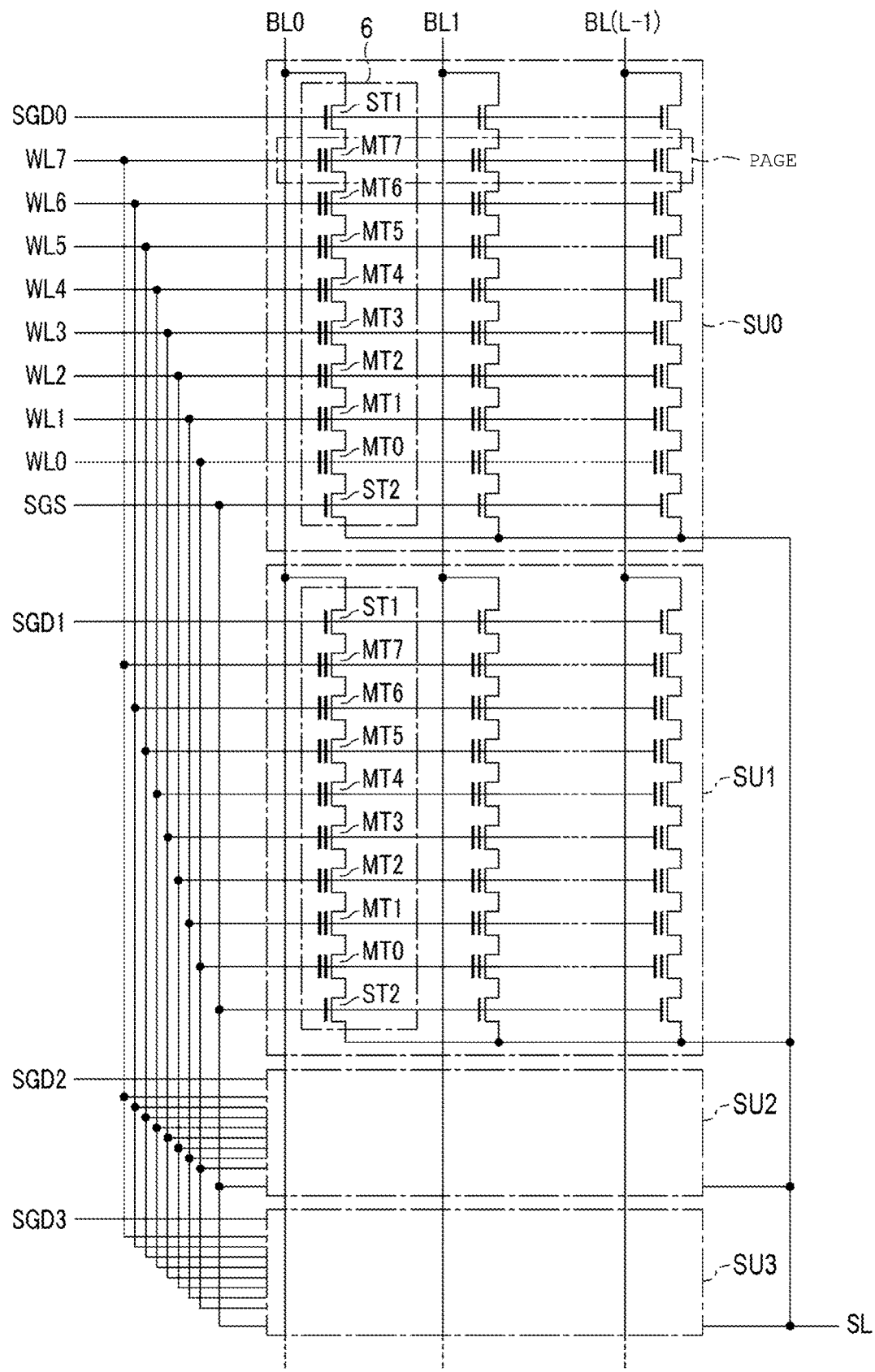
FIG. 2 is a circuit diagram of a memory cell array in the semiconductor memory device according to one embodiment.

Next, the configuration of the block BLK will be described with reference to FIG. 2. As described above, the block BLK includes, for example, four string units SU, and each string unit SU includes a plurality of NAND strings 6.

As illustrated, each of the NAND strings 6 includes, for example, eight memory cell transistors MT (MT0 to MT7) and select transistors ST1 and ST2. Each memory cell transistor MT includes a control gate and a charge storage layer, and stores data in a nonvolatile manner. The memory cell transistors MT are connected in series between a source of the select transistor ST1 and a drain of the select transistor ST2.

Gates of the select transistors ST1 in each of the string units SU0 to SU3 are connected to select gate lines SGD0 to SGD3, respectively. In contrast, gates of the select transistors ST2 in each of the string units SU0 to SU3 are commonly connected to, for example, a select gate line SGS. Of course, the gates of the select transistors ST2 may be connected to different select gate lines SGS0 to SGS3 for each string unit. Control gates of the memory cell transistors MT0 to MT7 in the same block BLK are commonly connected to word lines WL0 to WL7, respectively.

The drains of the select transistor ST1 of the NAND strings 6 in the string unit SU are connected to different bit lines BL (BL0 to BL(L−1), where L is a natural number of 2 or more), respectively. The bit line BL commonly connects one NAND string 6 in each string unit SU across the plurality of blocks BLK. Furthermore, the sources of the plurality of select transistors ST2 are commonly connected to a source line SL.

That is, the string unit SU is an aggregate of NAND strings 6 connected to different bit lines BL and connected to the same select gate line SGD. The block BLK is an aggregate of a plurality of string units SU sharing the word lines WL. The memory cell array 2 is an aggregate of a plurality of blocks BLK sharing the bit line BL.

In this example, one memory cell transistor MT can store, for example, 3-bit data. The 3-bit data includes a lower bit, a middle bit, and an upper bit. In the same string unit SU, a set of the lower bits stored by memory cells connected to the same word line WL is referred to as a lower page, a set of the middle bits is referred to as a middle page, and a set of the upper bits is referred to as an upper page. That is, three pages are allocated to one word line WL. Therefore, a "page" may be defined as a part of a memory space formed by memory cells connected to the same word line. Writing and reading of data are performed for each page. In the case of this example, one string unit SU includes eight word lines, and thus each string unit SU includes (3×8)=24 pages, and one block BLK includes four string units SU, and thus each block contains (24×4)=96 pages.

Figure 3:
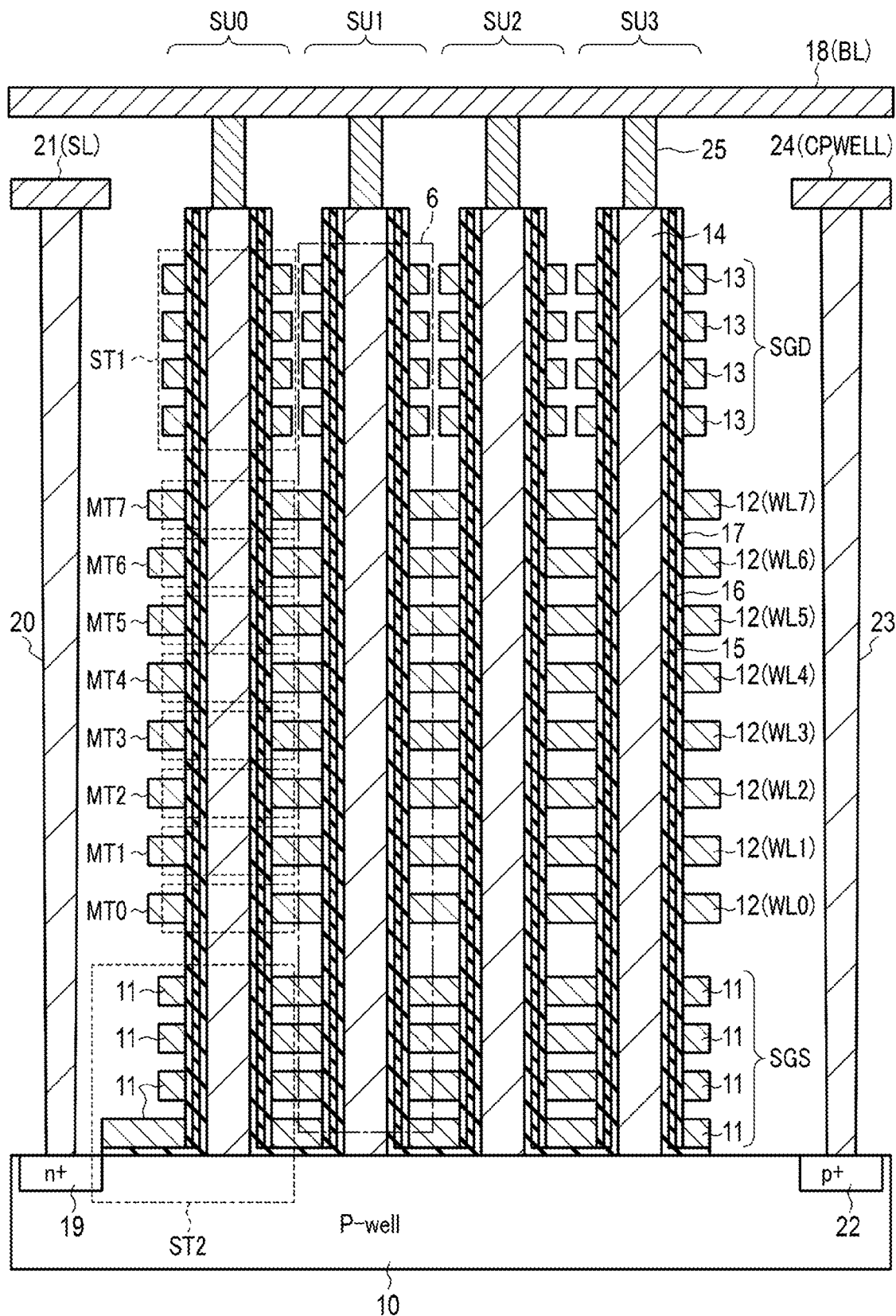
FIG. 3 is a cross-sectional view of the memory cell array in the semiconductor memory device according to one embodiment.

FIG. 3 is a cross-sectional view of a partial region of the block BLK. As illustrated, the plurality of NAND strings 6 are formed on a p-type well region 10. That is, on the p-type well region 10, for example, four wiring layers 11 functioning as select gate lines SGS, for example, eight wiring layers 12 functioning as word lines WL0 to WL7, and for example, four wiring layers 13 functioning as select gate lines SGD, are sequentially stacked. An insulating film (not illustrated) is formed between the stacked wiring layers.

A pillar-shaped conductor 14 that penetrates through these wiring layers 13, 12, and 11 and reaches the p-type well region 10 is formed. On the side surface of the conductor 14, a gate insulating film 15, a charge storage layer (which is either an insulating film or a conductive film) 16, and a block insulating film 17 are sequentially formed; these films and the wiring layers form the memory cell transistor MT and the select transistors ST1 and ST2. The conductor 14 functions as a current path of the NAND string 6, and is a region where a channel of each transistor is formed. The upper end of the conductor 14 is connected to a metal wiring layer 18 functioning as the bit line BL via a contact plug 25.

In an upper surface region of the p-type well region 10, an n$^+$ type impurity diffusion layer 19 is formed. A contact plug 20 is formed on the n+ type impurity diffusion layer 19, and the contact plug 20 is connected to a metal wiring layer 21 functioning as the source line SL. Furthermore, a p$^+$ type impurity diffusion layer 22 is formed in the upper surface region of the p-type well region 10. A contact plug 23 is formed on the p$^+$ type impurity diffusion layer 22, and the contact plug 23 is connected to a metal wiring layer 24 functioning as a well wiring CPWELL. The well wiring CPWELL is a wiring for applying voltage to the conductor 14 via the p-type well region 10.

In the configuration as described above, the string unit SU includes a set of the plurality of NAND strings 6 arranged and aligned in the depth direction of the paper surface of FIG. 3.

1.1.3 Configuration of Sense Amplifier

Figure 4:
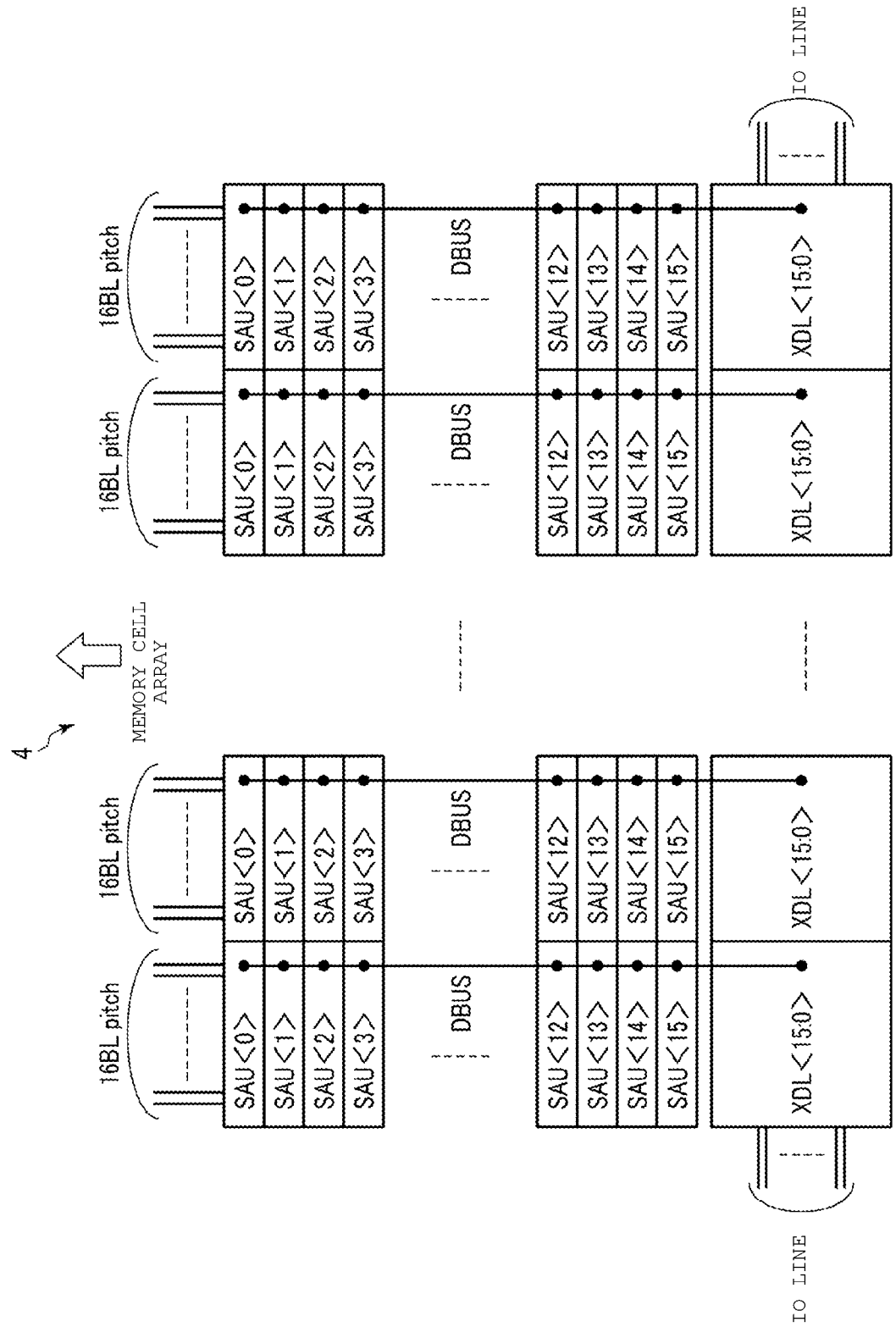
FIG. 4 is a block diagram of a sense amplifier in the semiconductor memory device according to one embodiment.

Next, the configuration of the sense amplifier 4 will be described with reference to FIG. 4.

1.1.3.1 Overall Configuration of Sense Amplifier

As illustrated, the sense amplifier 4 includes a plurality of sense amplifier units SAU and a plurality of latch circuits XDL.

The sense amplifier unit SAU is provided, for example, for each bit line BL, senses data read into the corresponding bit line BL, and transfers write data to the corresponding bit line BL. For example, sixteen sense amplifier units SAU are commonly connected to one bus DBUS. The number of sense amplifier units SAU connected to one bus DBUS is not limited to any particular number. In the following description, the sixteen sense amplifier units SAU commonly connected to one bus DBUS are distinguished from each other by referring to them as SAU <0> to SAU <15>, respectively.

The latch circuit XDL is provided for each sense amplifier unit SAU, and temporarily stores data related to corresponding bit line BL. Sixteen latch circuits XDL <15:0> respectively corresponding to the sense amplifier units SAU <0> to SAU <15> are commonly connected to one bus DBUS. Each latch circuit XDL is connected to a data line IO. The latch circuit XDL is used for transmitting and receiving data between the sense amplifier unit SAU and the outside via the bus DBUS and the data line IO. That is, for example, data received from an external controller or the like is first stored in the latch circuit XDL via the data line IO, and then transferred to the sense amplifier unit SAU via the bus DBUS. The reverse is also true. Although FIG. 4 illustrates an example in which sixteen latch circuits XDL <15:0> are commonly connected to one bus DBUS, each of the sixteen latch circuits XDL <15:0> may be connected to each of sixteen buses DBUS.

1.1.3.2 Configuration of Sense Amplifier Unit

Next, the configuration of the sense amplifier unit SAU will be described with reference to FIG. 5. In this embodiment, a current sense type sense amplifier unit SAU for sensing a current flowing through the bit line BL is described as an example; in another example of this embodiment, a voltage sense type sense amplifier unit SAU may be used.

Figure 5:
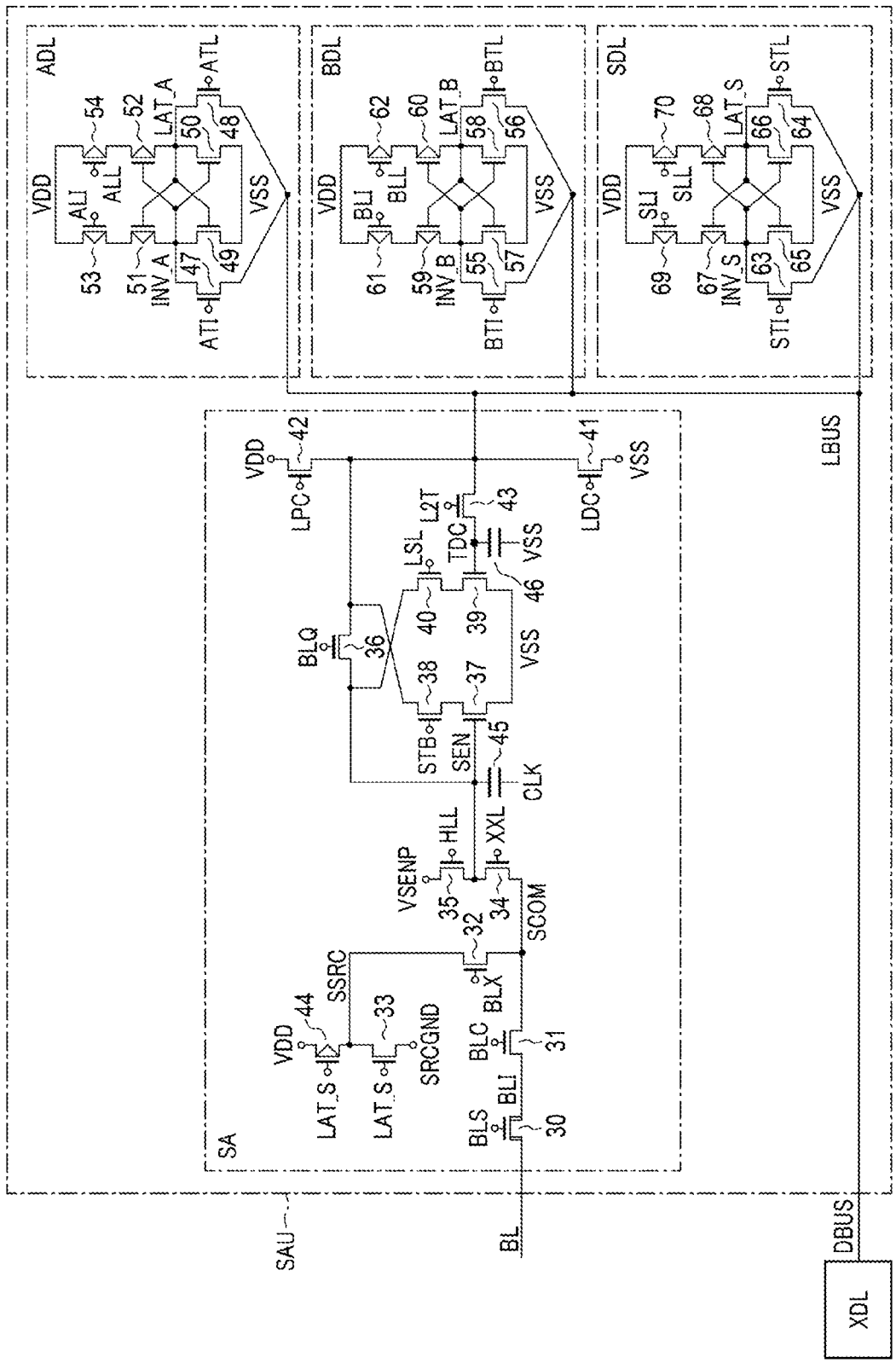
FIG. 5 is a circuit diagram of the sense amplifier in the semiconductor memory device according to one embodiment.

As illustrated in FIG. 5, the sense amplifier unit SAU includes a sense amplifier section SA and, for example, three latch circuits (SDL, ADL, and BDL).

The sense amplifier section SA senses data read into the bit line BL, and applies a voltage to the bit line BL according to write data. That is, the sense amplifier section SA is a module that directly controls the bit line BL. Furthermore, the module performs an AND operation or an OR operation using data in the latch circuits SDL, ADL, and BDL.

Next, details of the circuit of the sense amplifier section SA will be described. In the following description, one of the source and the drain of the transistor is referred to as "one end of the current path", and the other of the source and the drain is referred to as "the other end of the current path".

As illustrated, the sense amplifier section SA includes a high breakdown voltage n-channel MOS transistor 30, low breakdown voltage n-channel MOS transistors 31 to 43, a low breakdown voltage p-channel MOS transistor 44, and capacitor elements 45 and 46.

In the transistor 30, a signal BLS is input to the gate, one end of the current path is connected to the corresponding bit line BL, and the other end of the current path is connected to a node BLI. In the transistor 31, a signal BLC is input to the gate, one end of the current path is connected to the node BLI, and the other end of the current path is connected to a node SCOM. The transistor 31 is for clamping the corresponding bit line BL to voltage according to the signal BLC.

In the transistor 32, a signal BLX is input to the gate, one end of the current path is connected to the node SCOM, and the other end of the current path is connected to a node SSRC. In the transistor 33, the gate is connected to a node LAT_S, one end of the current path is connected to the node SSRC, and the other end of the current path is connected to a node SRCGND. For example, a ground voltage VSS is applied to the node SRCGND. In the transistor 44, the gate is connected to the node LAT_S, a power supply voltage VDD is applied to one end of the current path, and the other end of the current path is connected to a node SSRC. In the transistor 34, a signal XXL is input to the gate, one end of the current path is connected to the node SCOM, and the other end of the current path is connected to a node SEN. In the transistor 35, a signal HLL is input to the gate, a voltage VSENP is applied to one end of the current path, and the other end of the current path is connected to the node SEN.

One electrode of the capacitor element 45 is connected to the node SEN, and a clock CLK is input to the other electrode.

In the transistor 37, the gate is connected to the node SEN, one end of the current path is connected to one end of the current path of the transistor 38, and the other end of the current path is grounded. In the transistor 38, a signal STB is input to the gate, and the other end of the current path is connected to a bus LBUS. In the transistor 36, a signal BLQ is input to the gate, one end of the current path is connected to the node SEN, and the other end of the current path is connected to the bus LBUS. In the transistor 39, the gate is connected to a node TDC, one end of the current path is connected to one end of the current path of the transistor 40, and the other end of the current path is grounded. In the transistor 40, a signal LSL is input to the gate, and the other end of the current path is connected to the node SEN.

One electrode of the capacitor element 46 is connected to the node TDC and the other electrode is grounded. The node TDC may also be used to indicate the capacitor element 46. That is, the capacitor element 46 may be parasitic capacitance of the node TDC.

In the transistor 43, a signal L2T is input to the gate, one end of the current path is connected to the node TDC, and the other end of the current path is connected to the bus LBUS.

In the transistor 41, a signal LDC is input to the gate, one end of the current path is connected to the bus LBUS, and the other end of the current path is grounded. In the transistor 42, a signal LPC is input to the gate, one end of the current path is connected to the bus LBUS, and the power supply voltage VDD is applied to the other end of the current path. Then, by turning the transistor 42 to an ON state and transferring the voltage VDD to the bus LBUS, the bus LBUS is pre-charged.

The latch circuits SDL, ADL, and BDL temporarily store data. In a write operation of data, the sense amplifier section SA controls the bit line BL according to data stored in the latch circuit SDL. The other latch circuits ADL and BDL are used, for example, to temporarily store data of each bit when each memory cell transistor stores data of 2 bits or more. The number of latch circuits is set, for example, according to an amount of data (the number of bits) that the memory cell transistor can store.

The latch circuit SDL includes low breakdown voltage n-channel MOS transistors 63 to 66 and low breakdown voltage p-channel MOS transistors 67 to 70.

In the transistor 63, a signal STI is input to the gate, one end of the current path is connected to the bus LBUS, and the other end of the current path is connected to a node INV_S. In the transistor 64, a signal STL is input to the gate, one end of the current path is connected to the bus LBUS, and the other end of the current path is connected to the node LAT_S. In the transistor 65, the gate is connected to the node LAT_S, one end of the current path is grounded, and the other end of the current path is connected to the node INV_S. In the transistor 66, the gate is connected to the node INV_S, one end of the current path is grounded, and the other end of the current path is connected to the node LAT_S. In the transistor 67, the gate is connected to the node LAT_S, and one end of the current path is connected to the node INV_S. In the transistor 68, the gate is connected to the node INV_S, and one end of the current path is connected to the node LAT_S. In the transistor 69, the signal SLI is input to the gate, one end of the current path is connected to the other end of the current path of the transistor 67, and the power supply voltage VDD is applied to the other end of the current path. In the transistor 70, a signal SLL is input to the gate, one end of the current path is connected to the other end of the current path of the transistor 68, and the power supply voltage VDD is applied to the other end of the current path.

In the latch circuit SDL, a first inverter is configured with the transistors 66 and 68, and a second inverter is configured with the transistors 65 and 67. The output of the first inverter and the input (node LAT_S) of the second inverter are connected to the bus LBUS via the transistor 64 for data transfer. The input of the first inverter and the output of the second inverter (node INV_S) are connected to the bus LBUS via the transistor 63 for data transfer. The latch circuit SDL stores data at the node LAT_S, and stores its inverted data at the node INV_S.

Since the latch circuits ADL and BDL have the same configuration as the latch circuit SDL, the description thereof is omitted. However the reference numerals and signal names of each transistor are different from those of the latch circuit SDL as illustrated in FIG. 5. That is, the transistors 47 to 54 in the latch circuit ADL and the transistors 55 to 62 in the latch circuit BDL correspond to the transistors 63 to 70 in the latch circuit SDL, respectively. The signals ATI and BTI and signals ATL and BTL correspond to signals STI and STL, respectively, and signals ALI and BLI and signals ALL and BLL correspond to signals SLI and SLL, respectively. In each sense amplifier unit SAU, the sense amplifier section SA and the three latch circuits SDL, ADL, and BDL are connected by the bus LBUS so that data can be transmitted and received between the sense amplifier section SA and the three latch circuits SDL, ADL, and BDL.

The bus LBUS is connected to the bus DBUS via a bus switch (not illustrated). This bus switch connects the sense amplifier section SA and the latch circuit XDL.

Various signals in the sense amplifier unit SAU having the configuration described above are provided by, for example, the control circuit 5.

1.2 Threshold Voltage Distribution of Memory Cell Transistor

Next, a possible threshold voltage distribution of the memory cell transistor MT according to this embodiment will be described with reference to FIG. 6. Hereinafter, in this embodiment, a case in which the memory cell transistor MT can store 8-value data will be described, but the data that can be stored in the memory cell transistor MT is not limited to 8-value data. In this embodiment, it is sufficient that the memory cell transistor MT can store data of 4 values or more (data of 2 bits or more).

Figure 6:
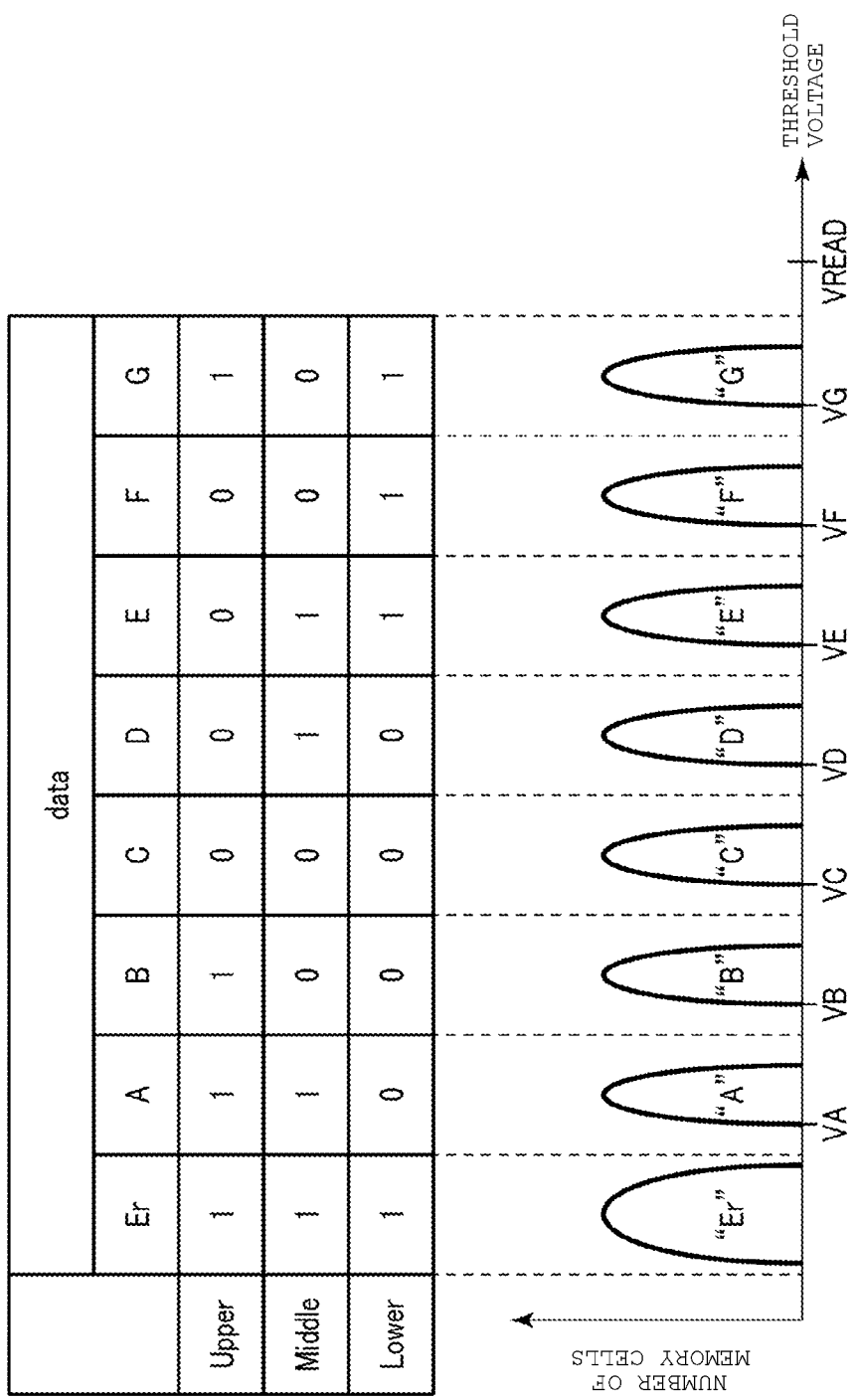
FIG. 6 is a threshold voltage distribution diagram of a memory cell transistor in the semiconductor memory device according to one embodiment.

FIG. 6 is a diagram illustrating possible data, a threshold voltage distribution of each memory cell transistor MT, and a voltage used in reading.

As illustrated, the memory cell transistor MT can take one of eight states depending on the threshold voltage. The eight states will be referred to as an "Er" state, an "A" state, a "B" state, a "C" state, a "D" state, an "E" state, an "F" state, and a "G" state in order from the one with the lowest threshold voltage.

The threshold voltage of the memory cell transistor MT in the "Er" state is lower than a voltage VA and corresponds to a data erase state. The threshold voltage of the memory cell transistor MT in the "A" state is equal to or higher than the voltage VA and lower than a voltage VB (>VA). The threshold voltage of the memory cell transistor MT in the "B" state is equal to or higher than the voltage VB and lower than a voltage VC (>VB). The threshold voltage of the memory cell transistor MT in the "C" state is equal to or higher than the voltage VC and lower than a voltage VD (>VC). The threshold voltage of the memory cell transistor MT in the "D" state is equal to or higher than the voltage VD and lower than a voltage VE (>VD). The threshold voltage of the memory cell transistor MT in the "E" state is equal to or higher than the voltage VE and lower than a voltage VF (>VE). The threshold voltage of the memory cell transistor MT in the "F" state is equal to or higher than the voltage VF and lower than a voltage VG (>VF). The threshold voltage of the memory cell transistor MT in the "G" state is equal to or higher than the voltage VG and lower than a voltage VREAD. Among the eight states, the "G" state is the state with the highest threshold voltage. The voltage VREAD is a voltage applied to a non-selected word line during a read operation, and is a voltage for turning ON the memory cell transistor MT irrespective of data stored therein.

The threshold voltage distribution described above is implemented by writing data of 3 bits including the lower bit, the middle bit, and the upper bit. That is, the relationship between the eight states described above and the lower, middle, and upper bits is as follows. "Er state: "111" (expressed in the order of "upper/middle/lower")

"A" state: "110"
"B" state: "100"
"C" state: "000"
"D" state: "010"
"E" state: "011"
"F" state: "001"
"G" state: "101"

As described above, only one of the 3 bits changes between data corresponding to two adjacent states in the threshold voltage distribution.

Accordingly, when reading the lower bit, a voltage corresponding to the boundary where the value of the lower bit ("0" or "1") changes may be used, and the same applies to the middle bit and the upper bit.

That is, as illustrated in FIG. 6, in the lower page read, the voltage VA for distinguishing between the "Er" state and the state and the voltage VE for distinguishing between the "D" state and the "E" state are used as read voltages. Read operations using the voltages VA and VE are referred to as read operations AR and ER, respectively.

In the middle page read, the voltage VB for distinguishing between the "A" state and the "B" state, the voltage VD for distinguishing between the "C" state and the "D" state, and the voltage VF for distinguishing between the "E" state and the "F" state are used as read voltages. Read operations using the voltages VB, VD, and VF are referred to as read operations BR, DR, and FR, respectively.

In the upper page read, the voltage VC for distinguishing between the "B" state and the "C" state and the voltage VG for distinguishing between the "F" state and the "G" state are used as read voltages. Read operations using the voltages VC and VG are referred to as read operations CR and GR, respectively.

The memory cell array 2 may have another configuration, e.g., the configuration described in, for example, U.S. patent application Ser. No. 12/407,403, filed on Mar. 19, 2009, entitled "THREE DIMENSIONAL STACKED NON-VOLATILE SEMICONDUCTOR MEMORY," U.S. patent application Ser. No. 12/406,524, filed Mar. 18, 2009, entitled "THREE DIMENSIONAL STACKED NONVOLATILE SEMICONDUCTOR MEMORY," U.S. patent application Ser. No. 12/679,991, filed Mar. 25, 2010, entitled "NON-VOLATILE SEMICONDUCTOR STORAGE DEVICE AND METHOD OF MANUFACTURING THE SAME," and U.S. patent application Ser. No. 12/532,030 filed on Mar. 23, 2009, entitled "SEMICONDUCTOR MEMORY AND METHOD FOR MANUFACTURING SAME." All of these patent applications are incorporated herein by reference in their entirety.

1.3 Interrupt Operation

Next, an interrupt operation according to this embodiment will be briefly described. The interrupt operation is an operation by which a write operation and the like are temporarily interrupted, for example, when the control circuit 5 receives a read command from the controller during the write operation, and the interrupted write operation and the like are resumed after the read operation is performed. Hereinafter, in this embodiment, a case in which the control circuit 5 receives a read command during a write operation, interrupts the write operation, executes the read operation, and then resumes the interrupted write operation will be described.

1.3.1 Command Sequence

Figure 7:
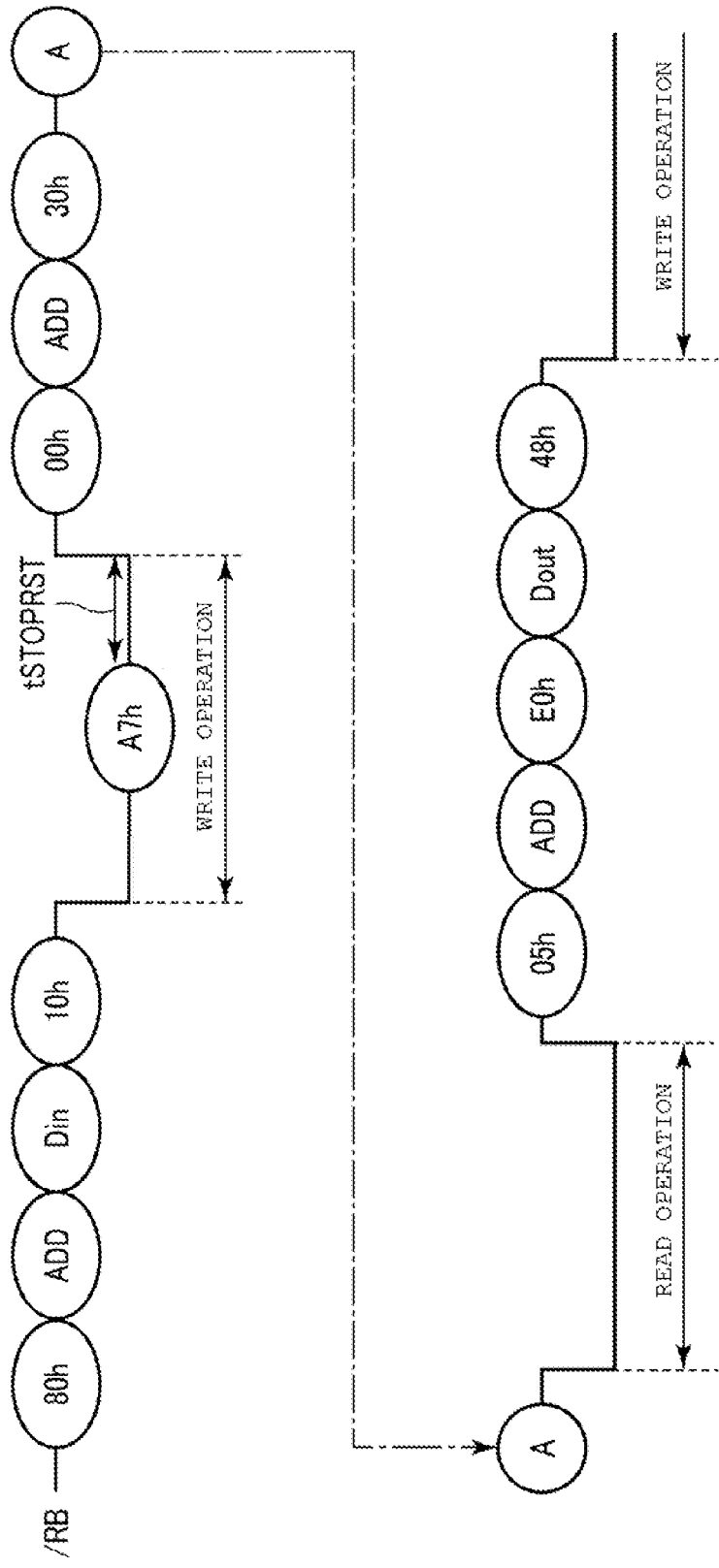
FIG. 7 is a timing chart illustrating a command sequence and a ready/busy signal in an interrupt operation of the semiconductor memory device according to one embodiment.

First, a command sequence of the interrupt operation will be described with reference to FIG. 7. FIG. 7 is a timing chart illustrating a command sequence and a signal /RB for a case in which a read command is received during a write operation, the write operation is interrupted, the read operation is executed, and then the interrupted write operation is resumed.

As illustrated, the controller issues a command "80h" and transmits the command to the NAND flash memory 1 when the NAND flash memory 1 is in a ready state. The command "80h" is a command for instructing a data write operation to the NAND flash memory 1.

Next, the controller issues an address ADD and transmits the address to the NAND flash memory 1. The address ADD designates, for example, a block BLK which is a write target and an address of a certain region in the block BLK.

Next, the controller transmits write data Din to the NAND flash memory 1. Subsequently, the controller issues a command "10h" and transmits the command to the NAND flash memory 1. The command "10h" is a command for executing a write operation.

When the command "10h" is stored in a register (not illustrated) in the NAND flash memory 1, the control circuit turns the signal /RB to the "L" level to notify the controller that the NAND flash memory 1 is in a busy state, and starts the write operation. During the write operation period, the signal /RB is maintained at "L" level.

Here, the write operation includes a program operation and a verification operation. The verification operation is an operation for determining whether or not the threshold voltage of the memory cell transistor MT after the program operation has increased to a desired value.

Next, the controller receives, for example, a high-priority read command from an external host device during the write operation. In response to receiving the high-priority read command, the controller issues a command "A7h" and transmits the command to the NAND flash memory 1. The command "A7h" is a command for notifying the NAND flash memory 1 that the write operation being executed is to be interrupted and a new operation is to be executed.

For example, when a write operation is being executed based on the command "10h", if the control circuit 5 receives the command "A7h", the control circuit 5 interrupts the write operation at the timing when the program operation or the verification operation is finished. Thereafter, the control circuit 5 turns the signal /RB to the "H" level as indicated by a broken line in FIG. 8. For that reason, when the write operation is being performed, a standby period tSTOPRST occurs between the time when the NAND flash memory 1 receives the command "A7h" and the time when the control circuit 5 turns the signal /RB to the "H" level, that is, until a read command can be received. During this standby period, for example, the control circuit 5 performs an operation of saving data required as a result of the interrupt. Details of this operation will be described later.

Subsequently, after confirming the signal /RB of "H" level, the controller issues a command "00h" and transmits the command to the NAND flash memory 1. The command "00h" is a command for instructing the NAND flash memory 1 to read data from the memory cell array 2. More specifically, in this embodiment, the command "00h" is a command for instructing the NAND flash memory 1 to read data from the memory cell array 2 into the latch circuit XDL.

Next, the controller issues an address ADD and transmits the address to the NAND flash memory 1. The address ADD designates, for example, a block BLK which is a read target and an address of a certain region in the block BLK. Here, the address ADD may designate any block BLK regardless of the block BLK for which the write operation is being performed.

Next, the controller issues a command "30h" and transmits the command to the NAND flash memory 1. The command "30h" is a command for causing the NAND flash memory 1 to execute an operation of reading data from the memory cell array 2 into the latch circuit XDL based on the address ADD transmitted immediately before.

When the command "30h" is stored in a register (not illustrated) in the NAND flash memory 1, the control circuit 5 turns the signal /RB to the "L" level, and starts the operation of reading data from the memory cell array 2. During this read operation, the control circuit 5 performs, for example, a refresh operation on the saved data. Details of this operation will be described later.

When the operation of reading data from the memory cell array 2 is completed, the control circuit 5 turns the signal /RB to the "H" level and notifies the controller that the NAND flash memory 1 is in the ready state.

Subsequently, after confirming the signal /RB of "H" level, the controller issues a command "05h" and transmits the command to the NAND flash memory 1. The command "05h" is a command for instructing the NAND flash memory 1 to output the data in the latch circuit XDL to an exterior of the NAND flash memory 1.

Next, the controller issues an address ADD and transmits the address to the NAND flash memory 1. The address ADD designates, for example, a block BLK which is a read target and an address of a certain region in the block BLK.

Next, the controller issues a command "E0h" and transmits the command to the NAND flash memory 1. The command "E0h" is a command for causing the NAND flash memory 1 to execute an operation of outputting data in the latch circuit XDL to an exterior of the NAND flash memory 1 based on the address ADD transmitted immediately before.

Thereafter, the controller repeatedly asserts the signal /RE. Each time the signal /RE is toggled, read data Dout is output to the controller.

After the output of the read data Dout to the controller is completed, the controller issues a command "48h" and transmits the command to the NAND flash memory 1. The command "48h" is a command for notifying the NAND flash memory 1 of resuming the interrupted write operation. When the command "48h" is received, the control circuit 5 turns the signal /RB to the "L" level and resumes the write operation to the block BLK which is a write target.

1.3.2 Operation of NAND Flash Memory

Figure 8:
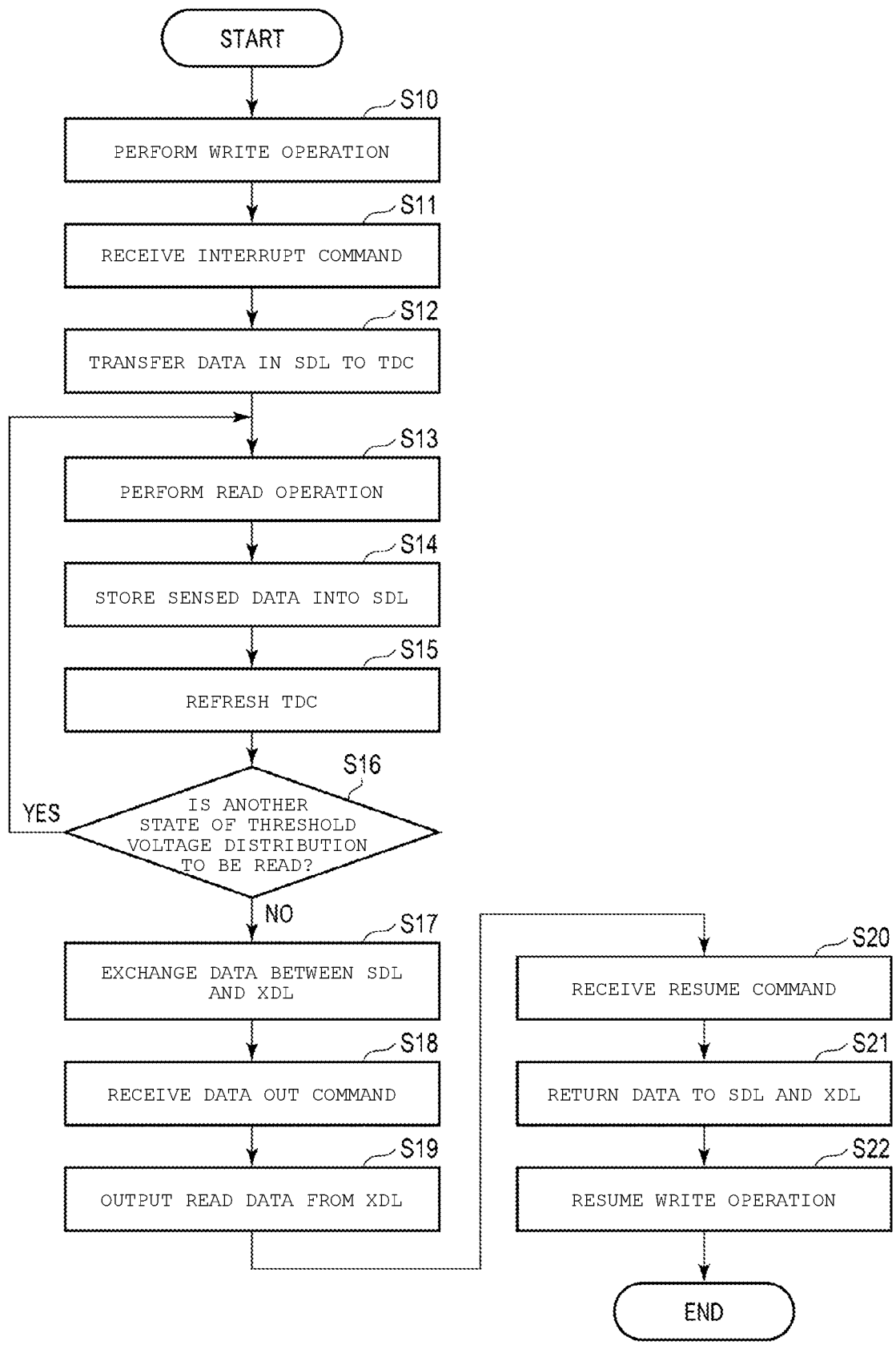
FIG. 8 is a flowchart illustrating the interrupt operation of the semiconductor memory device according to one embodiment.

Next, the operation of the NAND flash memory 1 in the interrupt operation will be described with reference to FIG. 8. FIG. 8 is a flowchart illustrating the operation of the NAND flash memory 1 in the interrupt operation.

As illustrated, first, when the command "10h" is received from the controller, the control circuit 5, for example, of the NAND flash memory 1 performs a write operation (Step S10).

For example, 3-bit write data is stored in the latch circuits XDL, ADL, and BDL of the corresponding sense amplifier 4. Then, a logical operation result of these 3-bit data is stored in the latch circuit SDL. Then, a write voltage is applied to the bit line BL according to the data of the latch circuit SDL.

Next, for example, the control circuit 5 of the NAND flash memory 1 receives the interrupt command "A7h" from the controller during the write operation (Step S11). In response to receiving the interrupt command, the control circuit 5 interrupts the write operation at the timing when the program operation or the verification operation is finished, and transitions the signal /RB to the "H" level.

After the signal /RB is transitioned to the "H" level, the control circuit 5 transfers the logical operation result of the 3-bit data stored in the latch circuit SDL to the node TDC (Step S12). This operation is a saving operation of the logical operation result, and is performed so that the latch circuit SDL can be later used to store the read data and the logical operation result will not be lost. During this period, although data transfer between the latch circuit SDL and the node TDC is being executed, the NAND flash memory is in a ready state, and thus a command from the controller can be received.

Next, when the command "30h" is received from the controller, the control circuit 5 reads data from the corresponding memory cell transistor MT (Step S13).

When data is read from the memory cell transistor MT, for example, the control circuit 5 of the NAND flash memory 1 stores the data (inverted data of the read data Dout) sensed at the node SEN in the latch circuit SDL (Step S14).

Next, for example, the control circuit 5 of the NAND flash memory 1 performs a refresh operation of the data stored at the node TDC (Step S15). This operation is performed so that the data stored in the node TDC is not lost with passage of time. Details of the refresh operation of the node TDC will be described later. The refresh operation of the node TDC may be performed at any time and at such a frequency that the data stored in the node TDC is not lost. For example, the refresh operation may be performed at fixed time intervals, such as once every few seconds.

Next, for example, the control circuit 5 of the NAND flash memory 1 determines whether or not to read another state of the threshold voltage distribution (Step S16). More specifically, for example, when reading the lower page in the order of read operation AR and read operation ER, if the read operation AR is already executed, it is determined that the read operation ER needs to be performed next, and if the read operation ER is already executed, it is determined that no further read operation is necessary. On the other hand, when reading the lower page in the order of the read operations ER and AR, the relationship between executions of the read operations is reversed.

When it is determined to read another state of the threshold voltage distribution (Yes in Step S16), the control circuit 5 performs the operation of reading another state of the threshold voltage distribution in Step S13. At this time, for example, when reading the lower page in the order of the read operation AR and the read operation ER, when the read operation ER is executed, the control circuit 5 stores a logical operation result of the data (inverted data of the read data Dout) sensed at the node SEN and the data that was stored in the latch circuit SDL during execution of the read operation AR, in the latch circuit SDL.

When it is determined not to read another state of the threshold voltage distribution (No in Step S16), the control circuit 5 of the NAND flash memory 1 sets the row address RA corresponding to the write operation in the row decoder 3, and then exchanges data between the latch circuit SDL and the latch circuit XDL in order to resume the write operation (Step S17). This operation is performed so that the data stored in the latch circuit SDL can be output from the latch circuit XDL to the controller.

Next, for example, the control circuit 5 of the NAND flash memory 1 receives the data out command "E0h" from the controller (Step S18).

When the data out command "E0h" is received from the controller, in response to receiving the data out command, for example, the control circuit 5 of the NAND flash memory 1 outputs the read data Dout from the latch circuit XDL (Step S19).

Next, for example, the control circuit 5 of the NAND flash memory 1 receives the resume command "48h" from the controller (Step S20).

When the resume command "48h" is received from the controller in response to receiving the resume command, for example, the control circuit 5 of the NAND flash memory 1 transitions the signal /RB to the "L" level and returns data to the latch circuit SDL and the latch circuit XDL (Step S21). This operation is performed to return the data of the latch circuit SDL and the latch circuit XDL to the state at the time of the interruption of the write operation and resume the write operation.

Next, for example, the control circuit 5 of the NAND flash memory 1 resumes the write operation (Step S22).

1.3.3 Data Transfer in Sense Amplifier

Next, data transfer in the sense amplifier 4 in the interrupt operation will be described with reference to FIG. 9. FIG. 9 is a diagram illustrating a state of data transfer in the sense amplifier 4 in the interrupt operation.

As illustrated, when the control circuit 5 receives the command "10h", write data Din1 to Din3 is stored in the latch circuits ADL, BDL, and XDL, respectively, and a logical operation result Dprog of the write data Din1 to Din3 is stored in the latch circuit SDL.

Figure 10A:
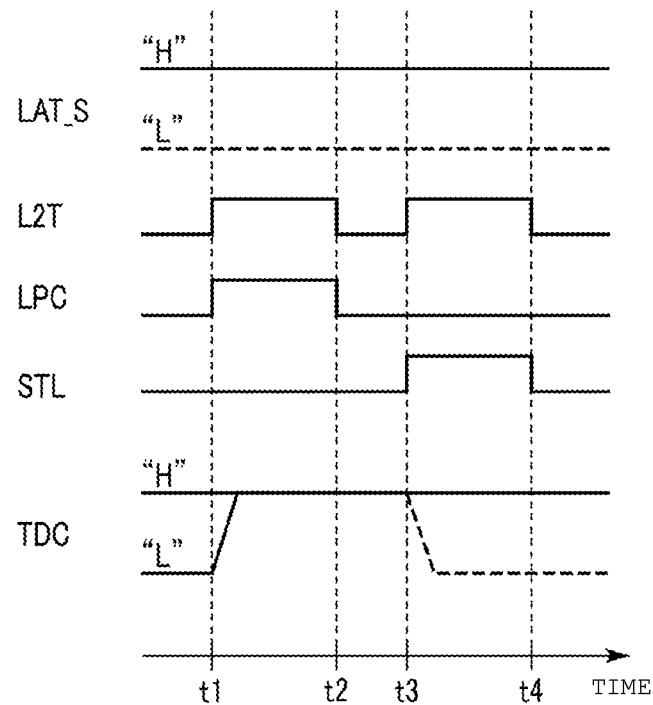
FIGS. 10A, 10B, and 10C are timing charts illustrating voltages of respective wirings during the interrupt operation of the semiconductor memory device according to one embodiment.

Next, when the control circuit 5 receives the interrupt command "A7h", the logical operation result Dprog is saved from the latch circuit SDL to the node TDC. FIG. 10A is a timing chart illustrating voltages of respective wirings at this time. Hereinafter, an operation of saving data from the latch circuit SDL to the node TDC will be described with reference to FIG. 10A.

First, the node TDC is reset. Specifically, as illustrated in FIG. 10A, at time t1, the control circuit 5 turns the signals LPC and L2T to the "H" level. With this configuration, the transistors 42 and 43 are turned to an ON state, and the node TDC is charged to the "H" level. Then, at time t2, the control circuit 5 turns the signals LPC and L2T to the "L" level. With this configuration, the transistors 42 and 43 are turned to an OFF state and the node TDC is maintained at the "H" level.

Next, the logical operation result Dprog stored in the latch circuit SDL is transferred to the node TDC. Specifically, as illustrated in FIG. 10A, at time t3, the control circuit 5 turns the signals L2T and STL to the "H" level. With this configuration, the transistors 43 and 64 are turned to the ON state, and the data stored by the node LAT_S of the latch circuit SDL is transferred to the node TDC. At this time, when the data stored by node LAT_S is at the "H" level, the node TDC goes to the "H" level, and when the data stored by the node LAT_S is at "L" level, the node TDC goes to the "L" level. Then, at time t4, the control circuit 5 turns the signals L2T and STL to the "L" level. With this configuration, the transistors 43 and 64 are turned to the OFF state, and the data stored by the node LAT_S is maintained at the node TDC.

Next, when the control circuit 5 receives the command "30h", the read data is stored in the latch circuit SDL.

After the operation of reading data from the memory cell array 2 is completed, data is exchanged between the latch circuit SDL and the latch circuit XDL. More specifically, for the block BLK which is a read target, the control circuit 5 transfers the inverted data of the write data Din3 stored in the latch circuit XDL to the node SEN, and then transfers the inverted data (read data Dout) of the data stored in the latch circuit SDL to the latch circuit XDL. Furthermore, for the block BLK which is a write target, the control circuit 5 transfers the inverted data (that is, the write data Din3) of the data stored at the node SEN to the latch circuit SDL. When the control circuit 5 receives the data out command "E0h", the read data Dout is output from the latch circuit XDL.

Figure 10B:
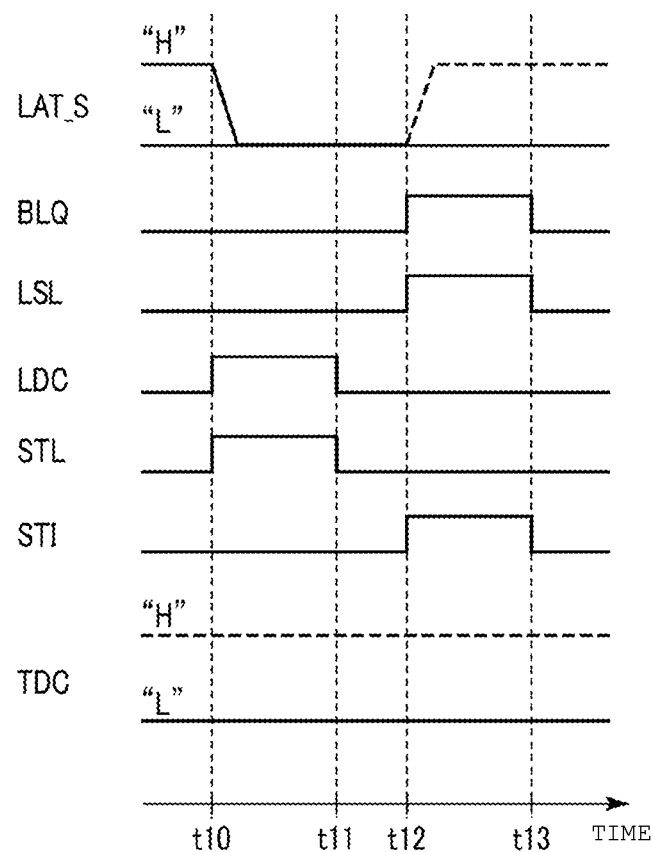

When the control circuit 5 receives the resume command "48h", the write data Din3 stored in the latch circuit SDL is returned to the latch circuit XDL, and then the logical operation result Dprog of the write data Din1 to Din3 stored in the node TDC is returned to the latch circuit SDL. Thereafter, the write operation is resumed. FIG. 10B is a timing chart illustrating the voltages of respective wirings at this time. Hereinafter, an operation of returning data from the node TDC to the latch circuit SDL will be described with reference to FIG. 10B.

First, the latch circuit SDL is reset. Specifically, as illustrated in FIG. 10B, at time t10, the control circuit 5 turns the signals LDC and STL to the "H" level. With this configuration, the transistors 41 and 64 are turned to the ON state, and the node LAT_S of the latch circuit SDL goes to the "L" level. Then, at time t11, the control circuit 5 turns the signals LDC and STL to the "L" level. With this configuration, the transistors 41 and 64 are turned to the OFF state, and the node LAT_S of the latch circuit SDL is maintained at the "L" level.

Next, the logical operation result of the write data Din1 to Din3 stored at the node TDC is transferred to the latch circuit SDL. Specifically, as illustrated in FIG. 10B, at time t12, the control circuit 5 turns the signals BLQ, LSL, and STI to the "H" level. With this configuration, the transistors 36, 40, and 63 are turned to the ON state. At this time, when the data at the node TDC is at the "H" level, the node INV_S of latch circuit SDL goes to the "L" level, and when the data at node TDC is at the "L" level, the node INV_S of the latch circuit SDL is maintained at the "H" level. As a result, the data at the node TDC is transferred to the node LAT_S of the latch circuit SDL. Then, at time t13, the control circuit 5 turns the signals BLQ, LSL, and STI to the "L" level. With this configuration, the transistors 36, 40, and 63 are turned to the OFF state, and the data at the node TDC is maintained at the node LAT_S of the latch circuit SDL.

1.3.4 Refresh Operation of Node TDC

Figure 10C:
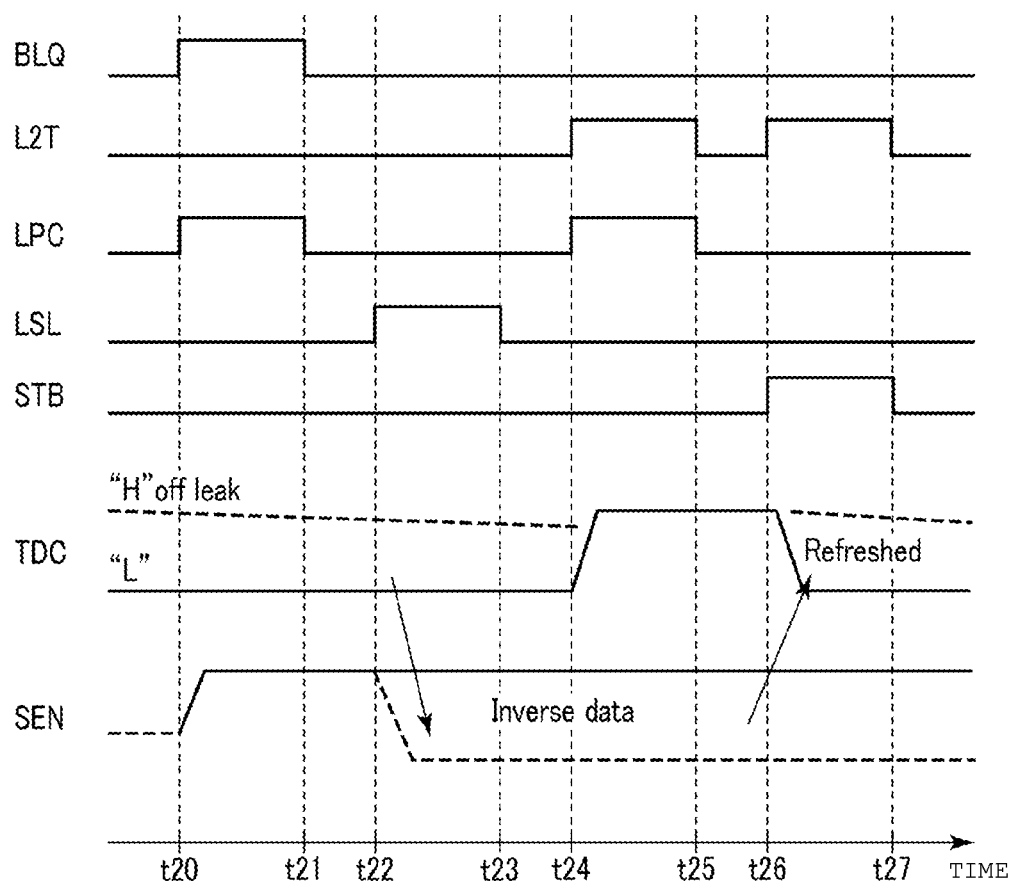

Next, the refresh operation of the node TDC in the interrupt operation will be described. The refresh operation of the node TDC is, in other words, a refresh operation of data stored by the capacitor element 46. In this embodiment, as illustrated in FIG. 9, the refresh operation of the node TDC can be performed, for example, after the control circuit 5 receives the command "30h" and the data (inverted data of the read data Dout) sensed at the node SEN is stored in the latch circuit SDL. FIG. 10C is a timing chart illustrating the voltages of respective wirings at this time. Hereinafter, the refresh operation of the node TDC will be described with reference to FIG. 10C.

First, the node SEN is reset. Specifically, as illustrated in FIG. 10C, at time t20, the control circuit 5 turns the signals BLQ and LPC to the "H" level. With this configuration, the transistors 36 and 42 are turned to the ON state, and the node SEN is charged to the "H" level. Then, at time t21, the control circuit 5 turns the signals BLQ and LPC to the "L" level. With this configuration, the transistors 36 and 42 are turned to the OFF state, and the node SEN is maintained at the "H" level.

Next, as illustrated in FIG. 10C, at time t22, the control circuit 5 turns the signal LSL to the "H" level. With this configuration, the transistor 40 is turned to the ON state. At this time, when the data at the node TDC is at the "H" level, the node SEN goes to the "L" level, and when the data at the node TDC is at the "L" level, the node SEN is maintained at the "H" level. Then, at time t23, the control circuit 5 turns the signal LSL to the "L" level. With this configuration, the transistor 40 is turned to the OFF state, and the node SEN is maintained at the stored data ("H" level or "L" level).

Next, the node TDC is reset. Specifically, as illustrated in FIG. 10C, at time t24, the control circuit 5 turns the signals LPC and L2T to the "H" level. With this configuration, the transistors 42 and 43 are turned to an ON state, and the node TDC is charged to the "H" level. Then, at time t25, the control circuit 5 turns the signals LPC and L2T to the "L" level. With this configuration, the transistors 42 and 43 are turned to an OFF state and the node TDC is maintained at the "H" level.

Next, as illustrated in FIG. 10C, at time t26, the control circuit 5 turns signals STB and L2T to the "H" level. With this configuration, the transistors 38 and 43 are turned to the ON state. At this time, when the data at node SEN is at the "H" level, the node TDC goes to the "L" level, and when the data at the node SEN is at the "L" level, the node TDC is maintained at the "H" level. Then, at time t27, the control circuit 5 turns the signals STB and L2T to the "L" level. With this configuration, the transistors 38 and are turned to the OFF state, and the node TDC is maintained at stored data ("H" level or "L" level).

As illustrated in FIG. 10C, although the voltage of the node TDC decreases due to off leak between time t20 and time t24, the node TDC is charged to the "H" level at time t24, and when the data of the node SEN is at the "H" level, the node TDC goes to the "L" level at time t26. Therefore, the data stored at the node TDC before the refresh operation is maintained.

1.4 Effects According to this Embodiment

According to the configuration of this embodiment, an increase in the area of the semiconductor memory device can be prevented. This effect will be described below.

In this embodiment, the capacitor element 46 is provided inside the sense amplifier 4. Then, the capacitor element 46 is used for temporarily storing data. For example, when a read operation interrupts during a write operation during the write operation, write data (a logical operation result of 3-bit data) stored in the latch circuit SDL can be saved in the capacitor element 46. That is, the capacitor element 46 can function as a dynamic cache. That is, since the capacitor element 46 can be used instead of the latch circuit, an interrupt operation can be performed without increasing the number of latch circuits and an increase in the area of the NAND flash memory 1 can be prevented.

The capacitor element 46 can also function as a part of operation elements in the sense amplifier 4 during an operation other than during an interruption. Therefore, an operation function of the sense amplifier 4 can be improved.

2. Modification Example and the Like

The semiconductor memory device according to the embodiment described above includes a bit line, a first memory cell electrically connected to the bit line and capable of storing data of 2 bits or more, and a sense amplifier that senses data read into the bit line and stores the data. The sense amplifier includes a first capacitor element (45) of which one electrode is connected to a first node (SEN) electrically connectable to the bit line, a first transistor (37) of which a gate is connected to the first node (SEN) and which is connectable to a second node (LBUS), a second transistor (43) connectable between the second node (LBUS) and a third node (TDC), a second capacitor element (46) of which one electrode is connected to the third node (TDC), and a latch circuit (SDL) connected to the second node (LBUS).

The embodiment described above is not the only embodiment, and various modifications may be made thereto. For example, the capacitor element 46 in the sense amplifier according to the embodiment described above can be configured as capacitance between wiring layers or capacitance between contact plugs CP. The configuration of the capacitor element 46 in these cases will be described with reference to FIGS. 11A to 11D. In FIGS. 11A to 11D, a semiconductor substrate 10, the diffusion layer 19, the diffusion layer 22, an element isolation area, and an insulating film are omitted.

Figure 11A:
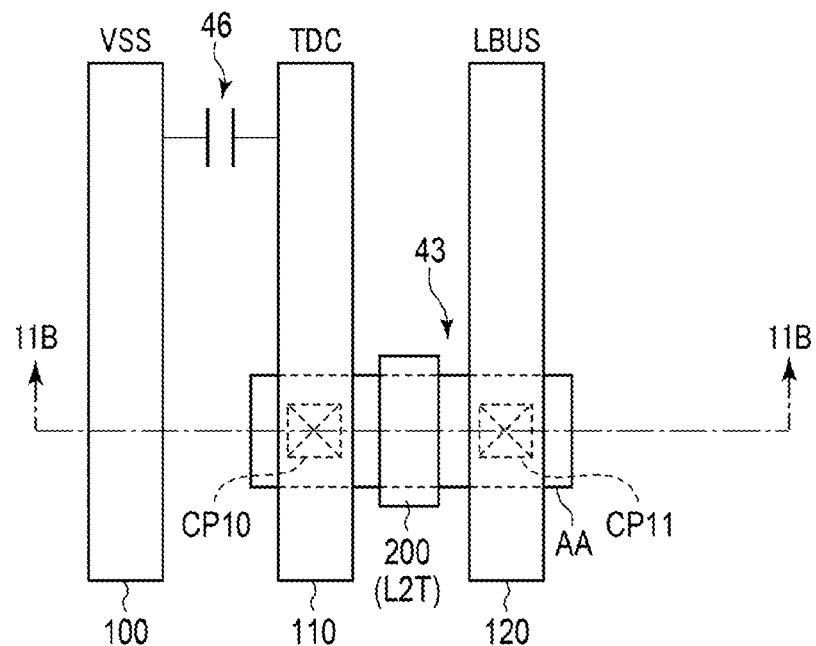
FIG. 11A is a top view illustrating a part of a sense amplifier in a semiconductor memory device according to a modification example of one embodiment.
Figure 11B:
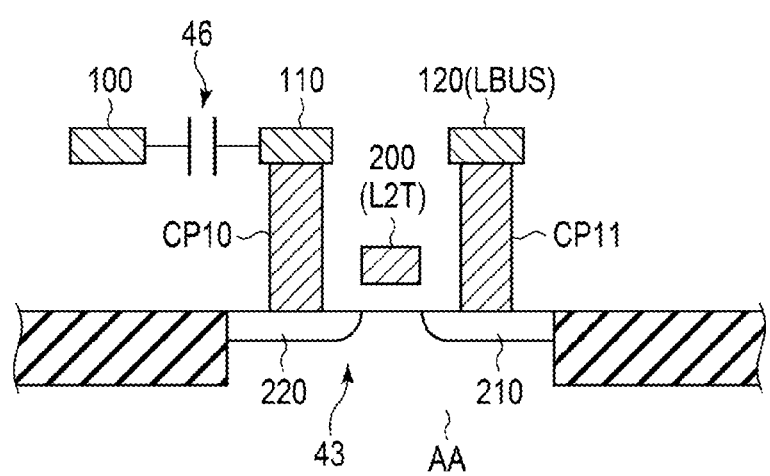
FIG. 11B is a cross-sectional view taken along line 11B-11B in FIG. 11A.

First, a case where the capacitor element 46 is configured as the capacitance between wiring layers will be described with reference to FIGS. 11A and 11B. FIG. 11B is a cross-sectional view taken along line 11B-11B in FIG. 11A.

As illustrated, the transistor 43 is formed on an element region AA of the semiconductor substrate 10. The transistor 43 includes impurity diffusion layers 210 and 220 provided in the front surface of the semiconductor substrate 10, and a gate electrode 200 provided on the semiconductor substrate 10 between the impurity diffusion layers 210 and 220 via a gate insulating film (not illustrated). A contact plug CP11 is provided on the impurity diffusion layer 210, and the contact plug CP11 is connected to the metal wiring layer 120 functioning as the bus LBUS. On the other hand, a contact plug CP10 is provided on the impurity diffusion layer 220, and the contact plug CP10 is connected to a metal wiring layer 110 functioning as the node TDC. On the same layer as the metal wiring layer 110, a metal wiring layer 100 for transmitting, for example, the voltage VSS is provided separately from the metal wiring layer 110. The metal wiring layer 110 is positioned between the metal wiring layers 100 and 120. Then, parasitic capacitance between the metal wiring layers 100 and 110 may be used as the capacitor element 46.

Figure 11C:
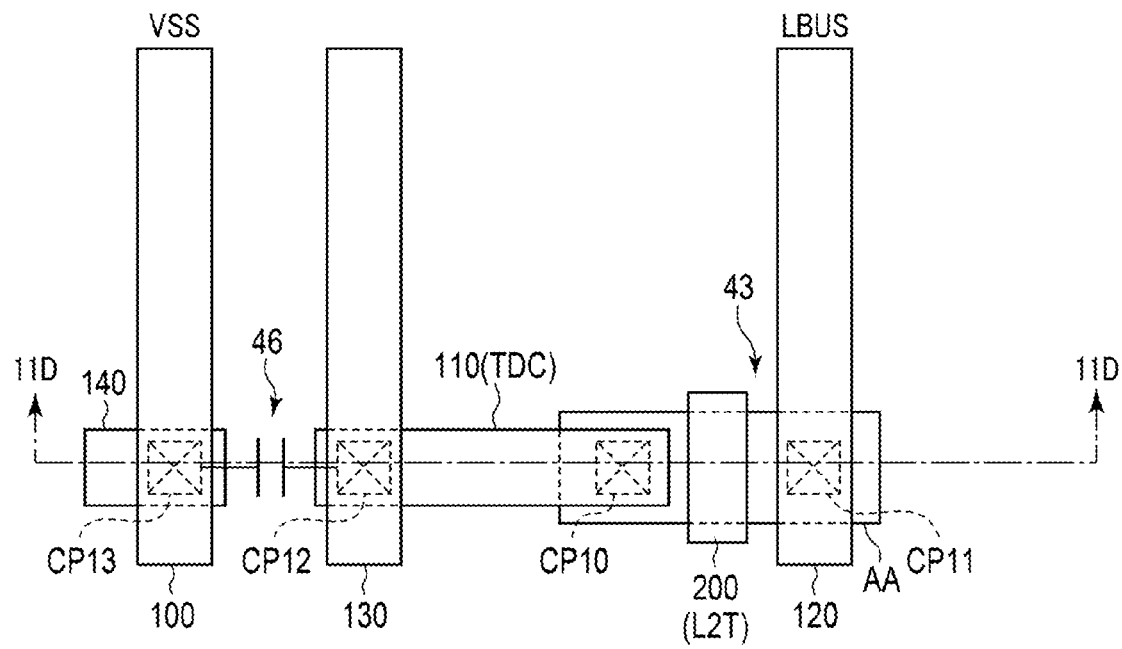
FIG. 11C is a top view illustrating a part of the sense amplifier in a semiconductor memory device according to another modification example of one embodiment.
Figure 11D:
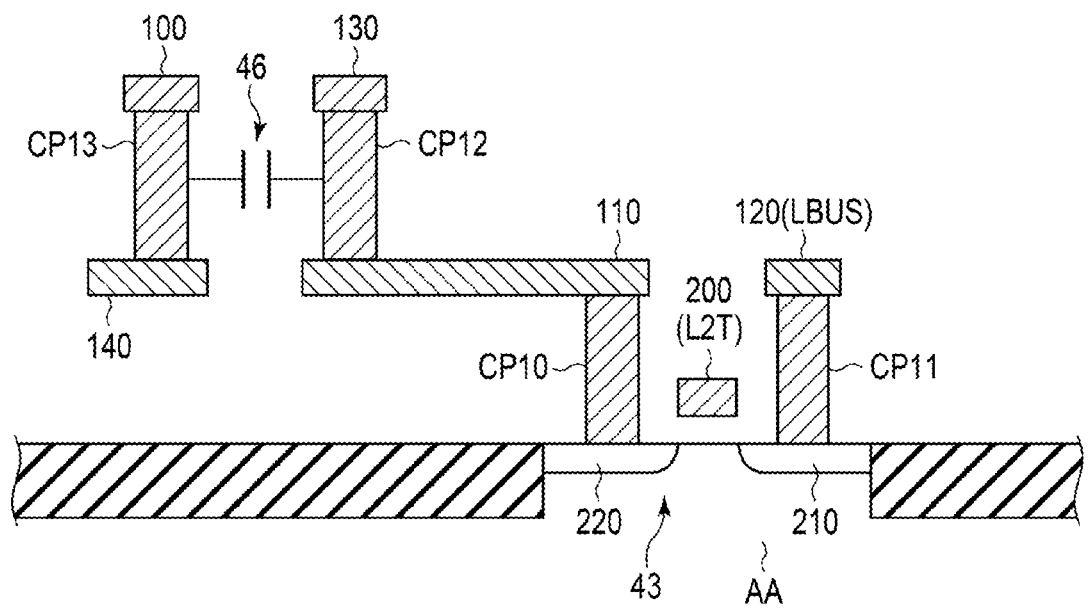
FIG. 11D is a cross-sectional view taken along line 11D-11D in FIG. 11C.

Next, a case where the capacitor element 46 is configured as the capacitance between the contact plugs CP will be described with reference to FIGS. 11C and 11D. FIG. 11D is a cross-sectional view taken along line 11D-11D in FIG. 11C. Hereinafter, only different points from FIG. 11A and FIG. 11B will be described.

On the same layer as the metal wiring layer 110, a metal wiring layer 140 is provided separately from the metal wiring layer 110. The metal wiring layer 110 is positioned between the metal wiring layers 120 and 140. A contact plug CP12 is provided on the metal wiring layer 110, and the contact plug CP12 is connected to a metal wiring layer 130. A contact plug CP13 is provided on the metal wiring layer 140, and the contact plug CP13 is connected to the metal wiring layer 100 that transmits, for example, VSS. The metal wiring layer 100 is provided on the same layer as the metal wiring layer 130. Then, parasitic capacitance between contact plugs CP12 and CP13 may be used as the capacitor element 46.

In the embodiment described above, although the transfer of data between the latch circuit SDL and the node TDC and the refresh operation of the node TDC in the interrupt operation are described, the timing at which these operations are performed is not limited to when the interrupt operation is performed. The node TDC can be used not only as a dynamic cache for storing data of the latch circuit SDL but also as an operation element.

In the embodiment described above, although the case where the data stored in the latch circuit SDL is transferred to the node TDC are described as an example, the transfer of data from the latch circuit to the node TDC is not limited to this case. For example, instead of saving the data stored in the latch circuit SDL to the node TDC, the data stored in the latch circuit ADL or the latch circuit BDL may be transferred to the node TDC. The operations between the latch circuit and the node TDC and between the latch circuits are not limited to the operations illustrated in FIG. 9. That is, the operation for that purpose is not particularly limited as long as data can be transferred between the latch circuit and the node TDC and between the latch circuits.

In the embodiment described above, although the case where the memory cell is a 3-bit memory cell is described, the embodiment described above is not limited to the case where the memory cell is the 3-bit memory cell, and can be applied to the case where the memory cell is a more memory cell of 2 bits or more.

The "connection" in the embodiment described above also includes a state where the connection is indirectly made with some other components such as a transistor or a resistor interposed therebetween.

Furthermore, in the embodiment described above, although a NAND flash memory is described as an example of a semiconductor memory device, the present disclosure is not limited to a NAND flash memory, and can be applied to other semiconductor memories in general and further to various memory devices other than a semiconductor memory. In the flowchart described in the above embodiment, the order of the processes can be changed as much as possible.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a bit line;
   a first memory cell electrically connected to the bit line; and
   a sense amplifier connected to the bit line,
   wherein the sense amplifier includes,
      a first capacitor element having an electrode that is connected to a first node electrically connectable to the bit line, a first transistor having a gate connected to the first node and a first end connectable to a second node,
a second transistor having a first end connected to the second node and a second end connected to a third node,
a second capacitor element having an electrode connected to the third node, and
a latch circuit connected to the second node,
wherein the sense amplifier is capable of transferring data stored in the latch circuit to the second capacitor element, and
wherein the sense amplifier further includes
a third transistor having a gate connected to the third node,
a fourth transistor having a first end connected to the third transistor and a second end connected to the first node,
a fifth transistor having a first end connected to the first node and a second end connected to the second node, and
the transfer of data from the second capacitor element to the latch circuit is performed using the third, fourth, and fifth transistors.

2. The semiconductor memory device according to claim 1,
wherein the semiconductor memory device is configured to transfer data stored in the latch circuit to the second capacitor element when a read command is received during an operation to write data to the first memory cell.

3. The semiconductor memory device according to claim 2,
wherein the latch circuit stores write data, which is transferred to the bit line during the write operation.

4. The semiconductor memory device according to claim 3, further comprising:
a second memory cell electrically connected to the bit line,
wherein the semiconductor memory device is configured to read data from the second memory cell according to the read command and cause the latch circuit to store the read data after the data stored in the latch circuit has been transferred to the second capacitor element.

5. The semiconductor memory device according to claim 4,
wherein the semiconductor memory device is configured to transfer the data stored in the second capacitor element to the latch circuit after the data read from the second memory cell has been output from the semiconductor memory device.

6. The semiconductor memory device according to claim 2,
wherein the transfer of data from the latch circuit to the second capacitor element is performed via the second transistor.

7. The semiconductor memory device according to claim 6,
wherein, when the data stored in the latch circuit is transferred to the second capacitor element,
the second capacitor element is charged, and
after the charging, the latch circuit goes into a state capable of outputting data stored therein to the second node, and the second transistor is turned ON.

8. The semiconductor memory device according to claim 1,
wherein, when the data stored in the second capacitor element is transferred to the latch circuit,
the latch circuit is reset, and
after the reset, the latch circuit goes into a state capable of receiving data stored in the second node, and the fourth and fifth transistors are turned ON.

9. A semiconductor memory device comprising:
a bit line;
a first memory cell electrically connected to the bit line; and
a sense amplifier connected to the bit line,
wherein the sense amplifier includes,
a first capacitor element having an electrode that is connected to a first node electrically connectable to the bit line,
a first transistor having a gate connected to the first node and a first end connectable to a second node,
a second transistor having a first end connected to the second node and a second end connected to a third node,
a second capacitor element having an electrode connected to the third node, and
a latch circuit connected to the second node,
wherein the sense amplifier is configured to refresh data stored in the second capacitor element using the first capacitor element.

10. The semiconductor memory device according to claim 9,
wherein the sense amplifier further includes
a third transistor having a gate connected to the third node,
a fourth transistor having a first end connected to the third transistor and a second end connected to the first node,
a fifth transistor having a first end connected to the first node and a second end connected to the second node,
a sixth transistor having a first end connected to the first transistor and a second end connected to the second node, and
when the data stored in the second capacitor element is refreshed,
the fifth transistor is turned ON to charge the first capacitor element,
the fourth transistor is turned ON and then OFF after the first capacitor element is charged,
after the fourth transistor is turned OFF, the second transistor is turned ON to charge the second capacitor element, and
after the second capacitor element is charged, the second and sixth transistors are turned ON.

11. The semiconductor memory device according to claim 10,
wherein, during the data read operation,
after the bit line is connected to the first node of the sense amplifier,
the sixth transistor is turned ON to transfer the data sensed at the first node to the latch circuit.

12. A semiconductor memory device comprising:
a bit line;
a first memory cell electrically connected to the bit line; and
a sense amplifier connected to the bit line,
wherein the sense amplifier includes,
a first capacitor element having an electrode that is connected to a first node electrically connectable to the bit line,
a first transistor having a gate connected to the first node and a first end connectable to a second node, a second transistor having a first end connected to the second node and a second end connected to a third node, a second capacitor element having an electrode connected to the third node, and a latch circuit connected to the second node, and wherein, during a refresh operation on data stored in the second capacitor element, the first capacitor element is fully discharged to a low level if the second capacitor element has a high level charge stored therein and fully charged to a high level if the second capacitor has a low level charge stored therein, and then the second capacitor element is fully discharged to the low level if the first capacitor element has a high level charge stored therein and fully charged to the high level if the first capacitor has a low level charge stored therein.

13. The semiconductor memory device according to claim 12, wherein the sense amplifier further includes a third transistor having a gate connected to the third node, a fourth transistor having a first end connected to the third transistor and a second end connected to the first node, a fifth transistor having a first end connected to the first node and a second end connected to the second node, a sixth transistor having a first end connected to the first transistor and a second end connected to the second node, and wherein, during a refresh operation on data stored in the second capacitor element, the fifth transistor is turned ON to charge the first capacitor element, the fourth transistor is turned ON and then OFF after the first capacitor element is charged, after the fourth transistor is turned OFF, the second transistor is turned ON to charge the second capacitor element, and after the second capacitor element is charged, the second and sixth transistors are turned ON.

14. A method of interrupting a write operation being carried out in a semiconductor memory device that includes a bit line, first and second memory cells electrically connected to the bit line, and a sense amplifier connected to the bit line, wherein the sense amplifier includes a first capacitor element having an electrode that is connected to a first node electrically connectable to the bit line, a first transistor having a gate connected to the first node and a first end connectable to a second node, a second transistor having a first end connected to the second node and a second end connected to a third node, a second capacitor element having an electrode connected to the third node, and a latch circuit connected to the second node, said method comprising:

transferring data stored in the latch circuit to the second capacitor element;

reading data from the second memory cell and storing the read data in the latch circuit; and after outputting the read data, storing the data transferred to the second capacitor element in the latch circuit in preparation for resuming the write operation.

15. The method of claim 14, wherein the semiconductor memory device further includes another latch circuit into which the read data is transferred and from which the read data is output.

16. The method of claim 15, further comprising:

prior to transferring the read data to said another latch circuit, transferring data stored in said another latch circuit to the sense amplifier.

17. The method of claim 14, further comprising:

before outputting the read data, refreshing the data transferred to the second capacitor element.

18. The method of claim 17, wherein said refreshing includes:

fully discharging the first capacitor element to a low level if the second capacitor element has a high level charge stored therein and fully charging the first capacitor to a high level if the second capacitor has a low level charge stored therein, and then fully discharging the second capacitor element to the low level if the first capacitor element has a high level charge stored therein and fully charging the second capacitor element to the high level if the first capacitor has a low level charge stored therein.

* * * * *

UNITED STATES PATENT AND TRADEMARK OFFICE
CERTIFICATE OF CORRECTION

| | |
|---|---|
| PATENT NO. | : 11,417,401 B2 |
| APPLICATION NO. | : 17/008209 |
| DATED | : August 16, 2022 |
| INVENTOR(S) | : Mario Sako et al. |

It is certified that error appears in the above-identified patent and that said Letters Patent is hereby corrected as shown below:

In the Claims

In Claim 6, Line 52, please delete "2" and replace with --1--.

Signed and Sealed this
Twentieth Day of December, 2022

Katherine Kelly Vidal
*Director of the United States Patent and Trademark Office*